United States Patent
Lee

(10) Patent No.: US 9,437,315 B2
(45) Date of Patent: Sep. 6, 2016

(54) DATA STORING SYSTEM AND OPERATING METHOD THEREOF

(71) Applicant: SK hynix Inc., Gyeonggi-do (KR)

(72) Inventor: Hyung Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 101 days.

(21) Appl. No.: 14/192,472

(22) Filed: Feb. 27, 2014

(65) Prior Publication Data

US 2015/0113322 A1   Apr. 23, 2015

(30) Foreign Application Priority Data

Oct. 22, 2013 (KR) .................. 10-2013-0125909

(51) Int. Cl.
| | |
|---|---|
| *G06F 11/10* | (2006.01) |
| *G06F 11/14* | (2006.01) |
| *G11C 11/56* | (2006.01) |
| *G11C 29/02* | (2006.01) |
| *G11C 7/14* | (2006.01) |
| *G11C 16/26* | (2006.01) |

(52) U.S. Cl.
CPC ........... *G11C 16/26* (2013.01); *G06F 11/1012* (2013.01); *G06F 11/141* (2013.01); *G11C 7/14* (2013.01); *G11C 11/5642* (2013.01); *G11C 29/021* (2013.01); *G11C 29/028* (2013.01)

(58) Field of Classification Search
CPC ... G11C 11/5642; G11C 16/26; G11C 29/42; G11C 11/5628
USPC ...................... 714/763; 365/185.11
See application file for complete search history.

(56) References Cited

U.S. PATENT DOCUMENTS

| | | | |
|---|---|---|---|
| 8,514,646 B1* | 8/2013 | Nan ............................ | 365/212 |
| 2005/0025022 A1* | 2/2005 | Nakagawa ................ | 369/59.23 |
| 2011/0066899 A1* | 3/2011 | Kang et al. ................. | 714/54 |
| 2011/0182119 A1* | 7/2011 | Strasser et al. ......... | 365/185.03 |
| 2012/0084490 A1* | 4/2012 | Choi et al. ................ | 711/103 |
| 2012/0203951 A1* | 8/2012 | Wood et al. ............... | 711/102 |
| 2013/0016562 A1* | 1/2013 | Mun ........................ | 365/185.12 |
| 2013/0070526 A1* | 3/2013 | Eun et al. ................ | 365/185.03 |
| 2013/0080858 A1* | 3/2013 | Lee et al. .................. | 714/773 |
| 2013/0132652 A1* | 5/2013 | Wood et al. ................ | 711/103 |
| 2013/0139036 A1* | 5/2013 | Lee ........................... | 714/773 |
| 2013/0258778 A1* | 10/2013 | Oh ........................... | 365/185.11 |
| 2014/0063967 A1* | 3/2014 | Ahn et al. ............... | 365/185.18 |
| 2014/0075241 A1* | 3/2014 | Oh et al. ................... | 714/15 |
| 2014/0101519 A1* | 4/2014 | Lee et al. ................ | 714/773 |

(Continued)

FOREIGN PATENT DOCUMENTS

| | | |
|---|---|---|
| KR | 100888842 | 3/2009 |
| KR | 1020120035064 | 4/2012 |
| KR | 1020130008302 | 1/2013 |

*Primary Examiner* — James C Kerveros
(74) *Attorney, Agent, or Firm* — IP&T Group LLP

(57) ABSTRACT

A data storing system includes a semiconductor device suitable for repeatedly performing a read operation by changing a level of a read voltage according to read voltages listed on a read retry table when a read operation on a selected page is passed, in response to a command and an address, and a controller suitable for controlling the read operation of the semiconductor device by generating the command and the address, wherein a read voltage to be used for performing the read operation is determined among the read voltages listed on the read retry table when the semiconductor device performs the read operation based on data read as a result of a predetermined number of read operations.

11 Claims, 8 Drawing Sheets

(56) References Cited

U.S. PATENT DOCUMENTS

2014/0233322 A1* 8/2014 Wu et al. .................. 365/185.24
2014/0281767 A1* 9/2014 Alhussien et al. ............ 714/721
2015/0006983 A1* 1/2015 Lin et al. ..................... 714/721
2015/0070988 A1* 3/2015 Park .......................... 365/185.03

\* cited by examiner

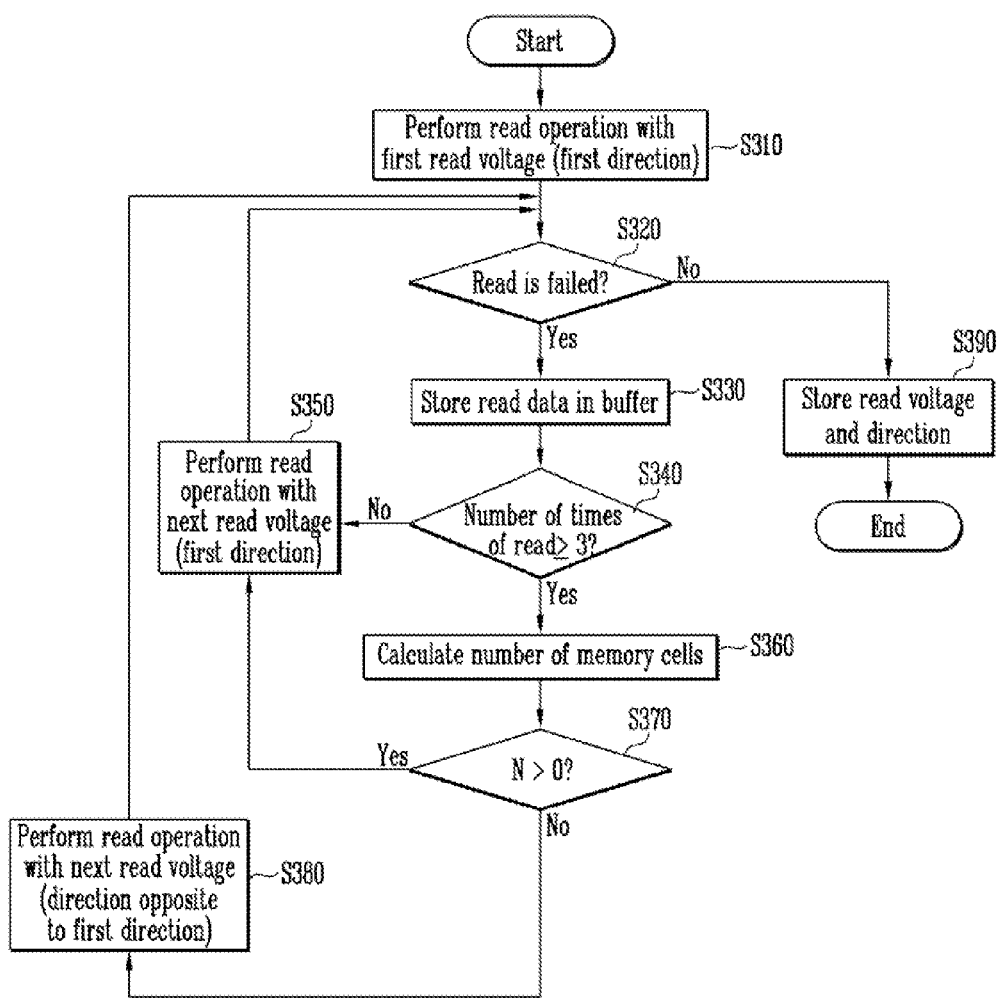

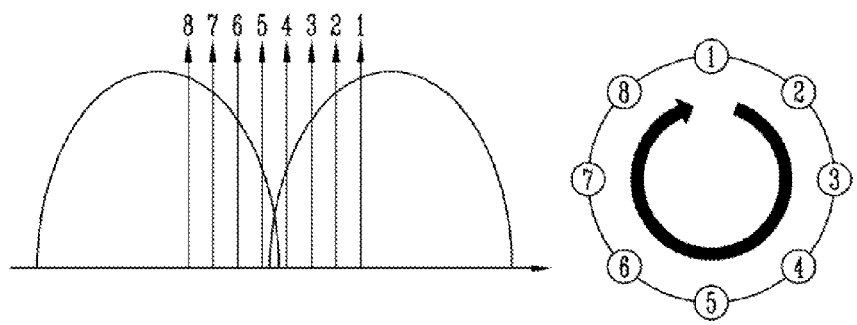
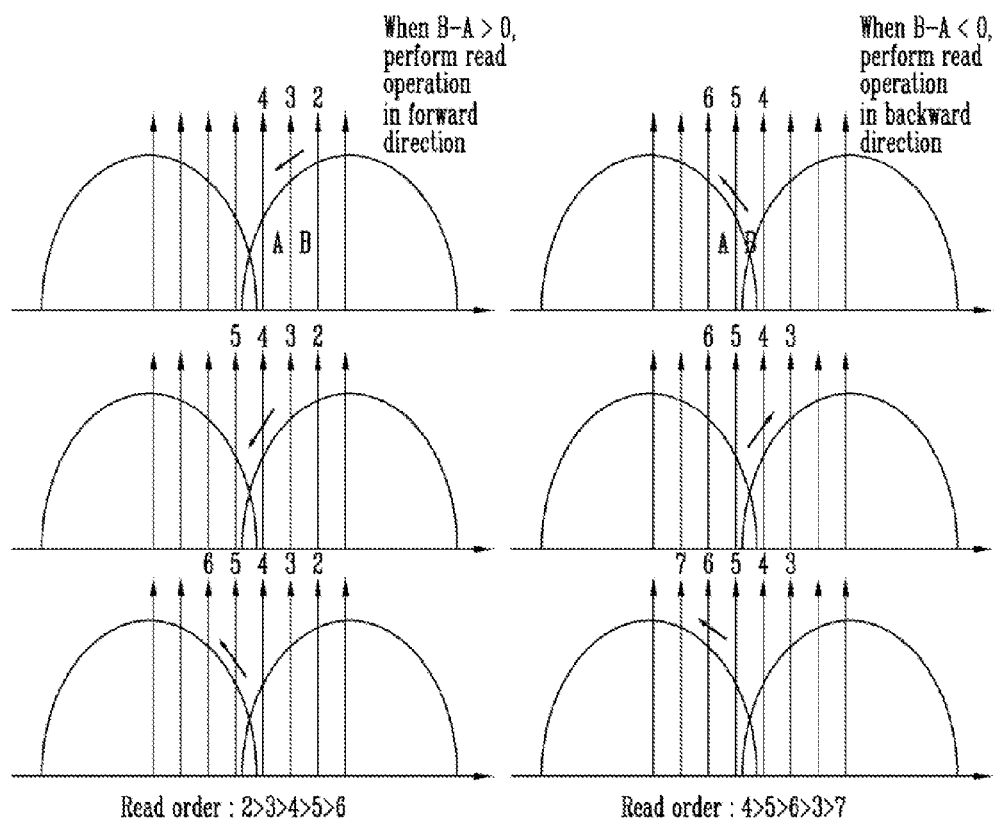

DATA STORING SYSTEM AND OPERATING METHOD THEREOF

CROSS-REFERENCE TO RELATED APPLICATIONS

The present application claims priority to Korean patent application number 10-2013-0125909 filed on Oct. 22, 2013, in the Korean Intellectual Property Office, the entire disclosure of which is incorporated by reference herein.

BACKGROUND

1. Technical Field

Various embodiments of the present invention relate to an electronic device, and more particularly, to a data storing system and an operating method of the data storing system.

2. Related Art

A semiconductor memory device included in a data storing device may be classified into a volatile memory device and a non-volatile memory device.

A volatile memory device performs a read/write operation at a high speed, but loses stored data when a power supply is cut off. Meanwhile, a non-volatile memory device performs a read/write operation at a relatively low speed, but maintains stored data even when a power supply is cut off. Accordingly, the non-volatile memory device is used to store data to be maintained regardless of a power supply. The non-volatile memory device includes a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM) a Resistive RAM (RRAM), a Ferroelectric RAM (FRAM), and the like. Flash memories may be generally divided as either a NOR type or a NAND type.

The flash memories have an advantage of a RAM in which data is freely programmed and erased, and an advantage of the ROM maintaining stored data even when not powered. The flash memories are widely used as a storage medium of portable electronic devices, such as a digital camera, a Personal Digital Assistant (PDA), and an MP3 player.

It is required for the data storing system to have high data reliability.

SUMMARY

Various embodiments of the present invention are directed to a data storing system that may minimize performance deterioration and have high data reliability, and an operating method of the data storing system.

An embodiment of the present invention provides a method of operating a data storing system, including performing a read operation using a first read voltage listed on a read retry table, storing read data at a first position of a buffer when the read operation is failed, performing a read operation using a second read voltage adjacent to the first read voltage on a first direction in the read retry table, storing read data at a second position of the buffer when the read operation is failed, performing a read operation using a third read voltage adjacent to the second read voltage in the first direction on the read retry table, storing read data at a third position of the buffer when the read operation is failed, determining a read voltage to be used for the read operation among read voltages listed on the read retry table based on the data stored at the first to third positions of the buffer, and performing the read operation using the determined read voltage.

Another embodiment of the present invention provides a data storing system, including a semiconductor device suitable for repeatedly performing a read operation by changing a level of a read voltage according to read voltages listed on a read retry table when a read operation on a selected page is passed, in response to a command and an address, and a controller suitable for controlling the read operation of the semiconductor device by generating the command and the address, wherein a read voltage to be used for performing the read operation is determined among the read voltages listed on the read retry table when the semiconductor device performs the read operation based on data read as a result of a predetermined number of read operations.

According to the embodiments of the present invention, the data storing system may control a direction of changing a level of a read voltage on a read retry table. Accordingly, the number of read operations to be performed may be decreased, so that high data reliability may be achieved and deterioration of performance may be minimized.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 9 is a flowchart for describing an operating method of a data storing system according to an embodiment of the present invention;

FIGS. 10 and 11 are diagrams for describing a performance order of read operations described in FIG. 9;

DETAILED DESCRIPTION

Figure 1:
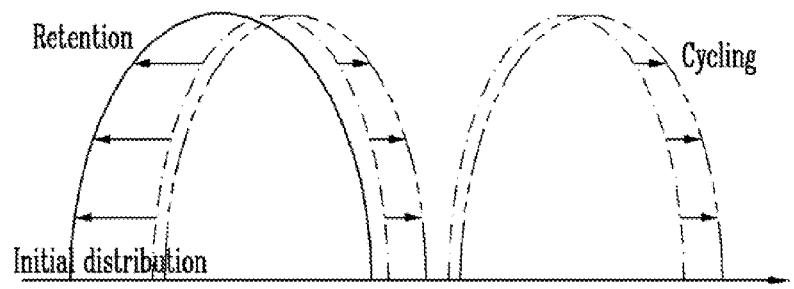
FIG. 1 is a diagram for describing changes in a threshold voltage distribution of memory cells.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a diagram for describing changes in a threshold voltage distribution of memory cells.

Referring to FIG. 1 an initial distribution of memory cells may be changed in a right direction according to an increase in the number of program/erase operation performances (i.e., the number of cycles).

The initial distribution of the memory cells may be changed in a left direction due to a retention characteristic. The retention characteristic means that a threshold voltage of a memory cell is decreased due to discharge of electrons stored in a floating gate (or a charge storing layer) as time passes.

According to the changes in the threshold voltage distribution of the memory cells as described above, a read operation on the memory cells may be failed.

Figure 2:
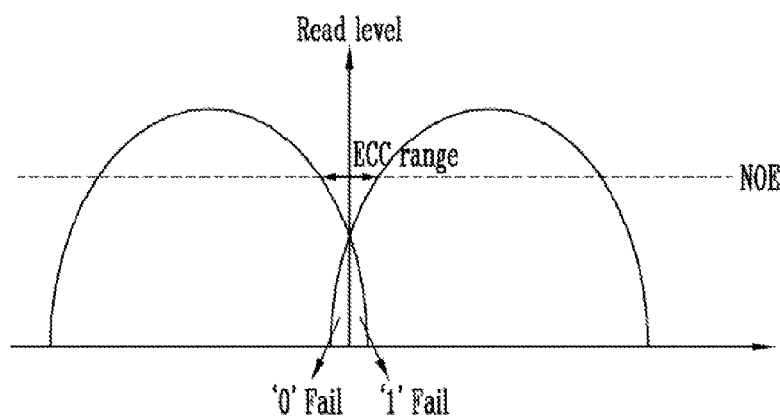
FIG. 2 is a diagram for describing a correction of an error generated in data read from memory cells.
Figure 3:
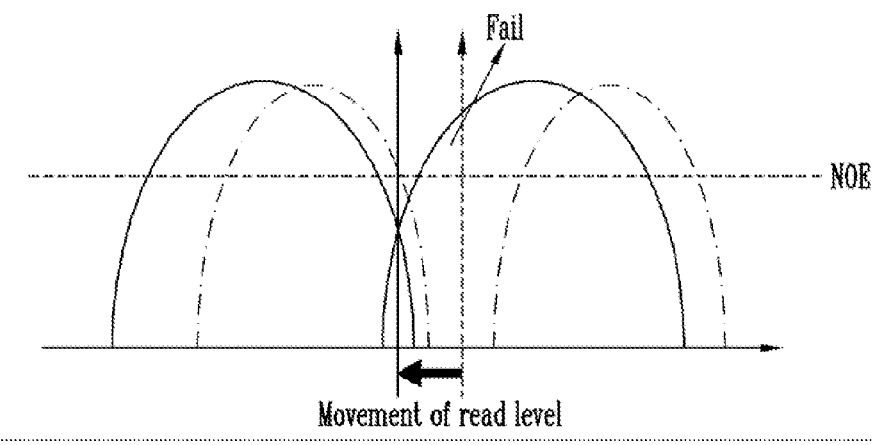
FIG. 3 is a diagram for describing an operation in a case where an error generated in data read from memory cells is not correctable.

FIG. 2 is a diagram for describing a correction of an error generated in data read from the memory cells. FIG. 3 is a diagram for describing an operation in a case where an error generated in data read from the memory cells is not correctable.

Referring to FIG. 2, two adjacent threshold voltage distributions may overlap due to the change in the threshold voltage distribution of the memory cells described in FIG. 1. Accordingly, there are generated fail cells (e.g., data '1' fail cells) having a threshold voltage equal to or larger than a read voltage and fail memory cells (e.g., data '2' fail cells) having a threshold voltage equal to or larger than the read voltage during a read operation on the memory cells.

An error generated during the read operation may be corrected. However, the number of correctable error bits (NOE) is limited. When the number of error bits generated during the read operation is within an ECC range, that is, the number of error bits is equal to or lower than the number of correctable error bits (NOE), the error is correctable, so that the read operation is not failed.

Referring to FIG. 3, when the number of error bits generated during the read operation exceeds the number of correctable error bits (NOE) the error is not correctable, and thus, the read operation is failed. When the read operation is failed, a level of the read voltage is changed to perform the read operation again, which is referred to as "read retry". A "read retry table" includes a list of a plurality of read voltages. A read voltage for a next read operation during the performance of the "read retry" is determined according to a read voltage order of the "read retry table". When the number of error bits generated by performing the read operation using the changed read voltage is equal to or smaller than the number of correctable error bits (NOE), the read operation is passed.

The "read retry", which may lead to repeatedly performing the read operation, may degrade performance of a device. Therefore, the "read retry" needs to be efficiently performed.

Figure 4:
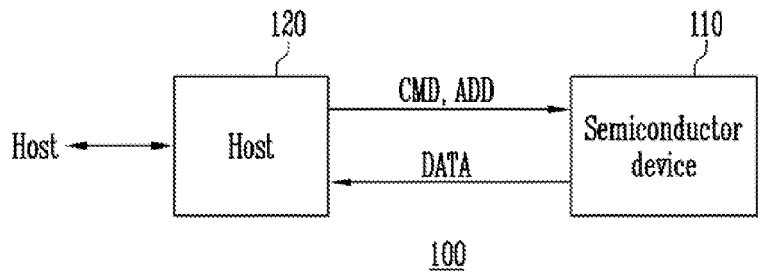
FIG. 4 is a block diagram for describing a data storing system according to an embodiment of the present invention.

FIG. 4 is a block diagram for describing a data storing system according to an embodiment of the present invention.

Referring to FIG. 4, a data storing system 100 may include a semiconductor device 110, and a controller 120 for controlling an operation of the semiconductor device 110 in response to a request of a host.

The semiconductor device 110 performs the read operation on memory cells of pages included in a memory block in response to a command CMD and an address ADD input from the controller 120. The semiconductor device 110 repeatedly performs the read operation while changing a level of a read voltage according to the read voltages listed on the read retry table until the read operation on a selected page is passed. The semiconductor device 110 programs data DATA input from the controller 120 on memory cells of a program target page, and outputs data DATA read from the memory cells to the controller 120.

The controller 120 determines a read voltage for performance of the read operation among the read voltages listed on the read retry table when the semiconductor device 110 performs the read operation based on the data read according to a result of the specific number of the read operations.

Figure 5:
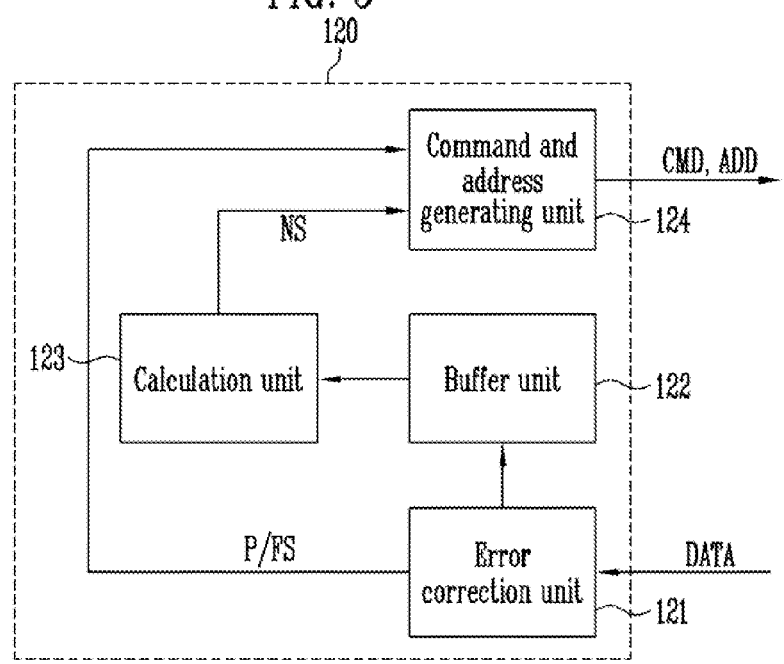
FIG. 5 is a detailed diagram of a controller illustrated in FIG. 4.

FIG. 5 is a detailed block diagram of the controller 120 illustrated in FIG. 4.

Referring to FIG. 5, the controller 120 may include an error correction unit 121, a buffer unit 122, a calculation unit 123, and a command and address generating unit 124.

The error correction unit 121 corrects an error bit of the read data DATA input from the semiconductor device 110, and compares the number of error bits of the read data DATA and the number of correctable error bits to determine pass or fail of the read operation.

When the read operation is failed, the buffer unit 122 stores the read data DATA. That is, when the read operation performed with a first read voltage listed on the read retry table is failed, the buffer unit 122 stores the read data DATA at a first position, when the read operation performed with a second read voltage adjacent to the first read voltage in a first direction on the read retry table is failed, the read data is stored at a second position, and when the read operation performed with a third read voltage adjacent to the second read voltage in the first direction on the read retry table is failed, the read data is stored at a third position.

The calculation unit 123 may calculate the number of memory cells between the read voltages during the performance of the read operation based on the data stored in the buffer unit 122. The calculation unit 123 calculates the number of first memory cells having threshold voltages between the first read voltage and the second read voltage, and the number of second memory cells having threshold voltages between the second read voltage and the third read voltage based on the data stored at the first to third positions of the buffer unit 122.

When the read operation is failed, the command and address generating unit 124 generates a command and an address to perform the read operation using a specific read voltage determined among the read voltages listed on the read retry table based on the number of memory cells. When the number of first memory cells is greater than the number of second memory cells, the command and address generating unit 124 generates a command to perform the read operation using the read voltage adjacent to the third read voltage in the first direction on the read retry table, and when the number of first memory cells is smaller than the number of second memory cells, the command and address generating unit 124 generates a command to perform a next read operation using the read voltage adjacent to the first read voltage in a second direction, which is opposite to the first direction, on the read retry table.

As an embodiment the first read voltage may be a read voltage when the read operation on a previous page is passed.

As an embodiment, the first direction may be a read operation performance direction used when the read operation on the previous page is passed.

When the read operation is passed, the semiconductor device may store the read voltage and the direction during the performance of the read operation.

Accordingly, the data storing system controls a direction, in which the read voltage is changed, in the read retry table, so that the number of the read operations may be decreased, thereby improving performance of the system.

Figure 6:
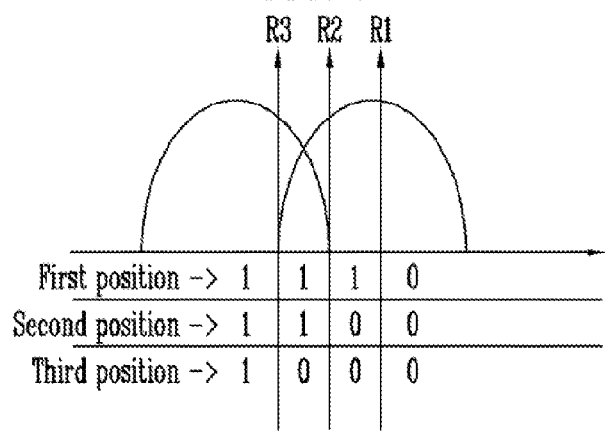
FIG. 6 is a diagram for describing data stored in a buffer unit illustrated in FIG. 5.

FIG. 6 is a diagram for describing the data stored in the buffer unit 122 illustrated in FIG. 5.

Referring to FIG. 6, when the read operation performed with the first read voltage R1 is failed, the buffer unit 122 stores the read data at the first position, when the read operation performed with the second read voltage R2 is failed, the buffer unit 122 stores the read data at the second position, and when the read operation performed with the third read voltage R3 is failed, the buffer unit 122 stores the read data at the third position.

In a case of the memory cells having threshold voltages equal to or greater than the first read voltage R1, "000" is stored at the first to third positions. In a case of the memory cells having threshold voltages equal to or greater than the second read voltage R2 and smaller than the first read voltage R1, "100" is stored at the first to third positions. In a case of the memory cells having threshold voltages equal to or greater than the third read voltage R3 and smaller than the second read voltage R2, "110" is stored at the first to third positions. In a case of the memory cells having threshold voltages smaller than the third read voltage R3, "111" is stored at the first to third positions. Accordingly, the number of memory cells between the read voltages may be recognized by counting the number of data "000", "100", "110", and "111".

Figure 7:
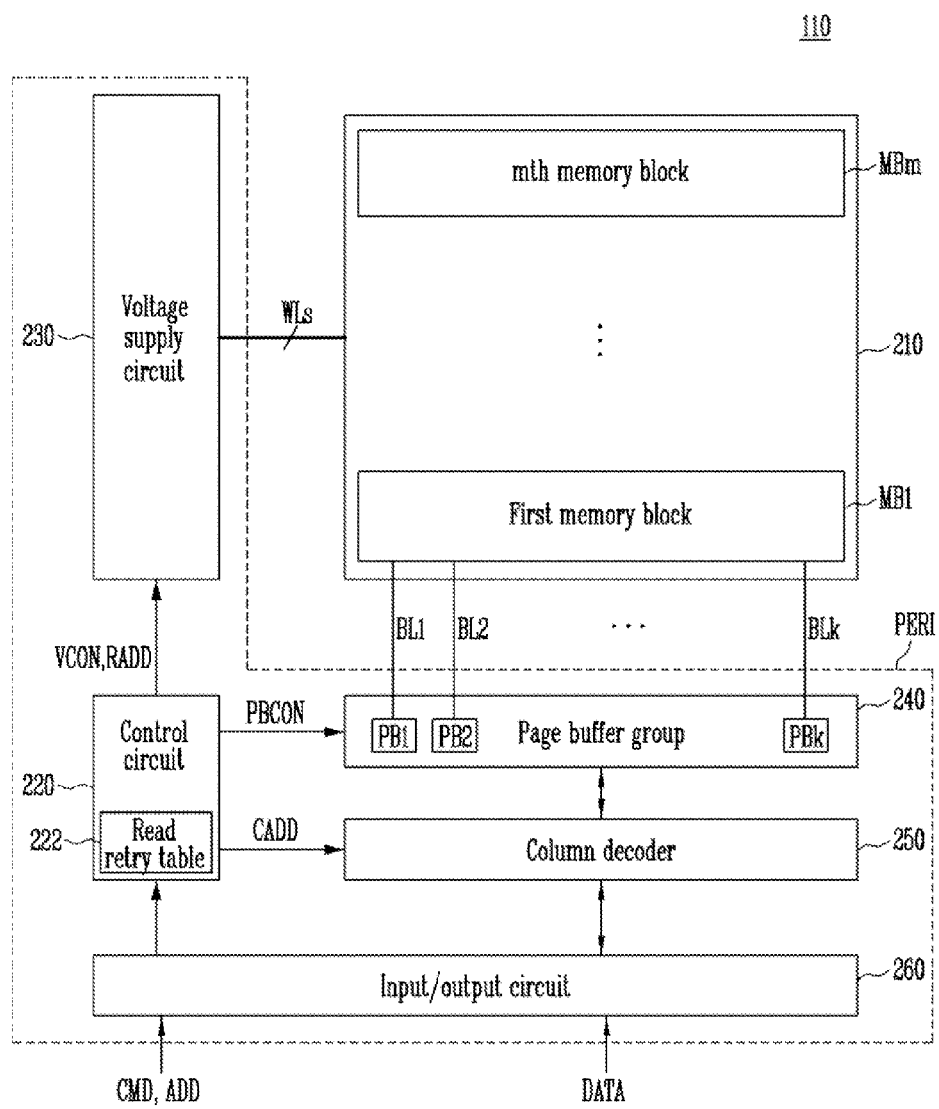
FIG. 7 is a detailed diagram of a semiconductor device illustrated in FIG. 4.
Figure 8:
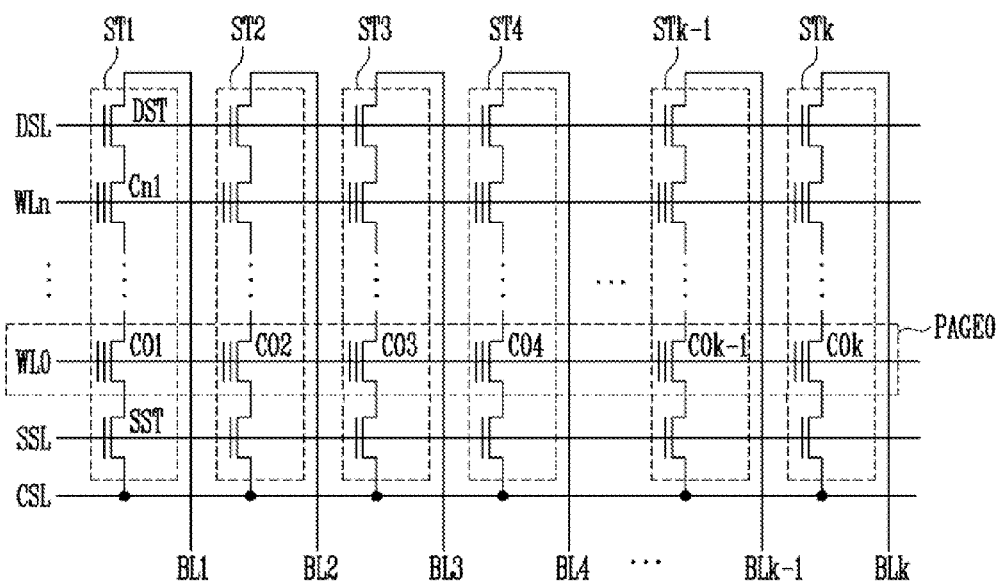
FIG. 8 is a detailed diagram for a memory block illustrated in FIG. 7.

FIG. 7 is a detailed block diagram of the semiconductor device 110 illustrated in FIG. 4. FIG. 8 is a detailed diagram of a memory block illustrated in FIG. 7.

Referring to FIG. 7, the semiconductor device 110 may include a memory array 210 including a first to m$^{th}$ memory blocks MB1 to MBm, and a peripheral circuit PERI configured to perform a read operation on memory cells included in a selected page of the memory blocks MB1 to MBm. The peripheral circuit PERI may include a control circuit 220, a voltage supply circuit 230, a page buffer group 240, a column decoder 250 and an input/output circuit 260.

Referring to FIG. 8 each memory block includes a plurality of strings ST1 to STk connected between bit lines BL1 to BLk and a common source line CSL. That is, the strings ST1 to STk are connected to the corresponding bit lines BL1 to BLk, respectively, and are commonly connected to the common source line CSL. Each string ST1 includes a source select transistor SST in which a source is connected to the common source line CSL, a plurality of memory cells C01 to Cn1, and a drain select transistor DST in which a drain is connected to the bit line BL1. The memory cells C01 to Cn1 are serially connected between the select transistors SST and DST. A gate of the source select transistor SST is connected to a source select line SSL, and gates of the memory cells C01 to Cn1 are connected to word lines WL0 to WLn, respectively, and a gate of the drain select transistor DST is connected to a drain select line DSL.

The memory cells included in the memory block may be divided in the unit of a physical page or a logical page. For example, the memory cells C01 to C0k connected to one word lines, for example, WL0, configure one physical page PAGE0. The page is a basic unit of the read operation.

The control circuit 220 outputs a voltage control signal VCON for generating a necessary voltage for performing a read operation in response to a command CMD input through the input/output circuit 260 from the outside, and outputs a PB control signal PBCON for controlling page buffers PB1 to PBk included in the page buffer group 240. Further, the control circuit 220 outputs a row address signal RADD and a column address signal CADD in response to an address signal ADD input from the outside through the input/output circuit 260. The control circuit 220 includes a read retry table 222. As described above, the read retry table 222 includes an order of the change of the read voltage when the read operation is repeatedly performed. A voltage difference between the read voltages is uniform. The control circuit 220 changes the read voltage according to the read voltage order in the read retry table 222 to perform the read operation. When the read operation is passed, the control circuit 220 stores the read voltage and the direction during the performance of the read operation.

The voltage supply circuit 230 supplies operating voltages necessary for the read operation on the memory cells to local lines including a drain select line DLS, the word lines WL0 to WLn, and the source select line SSL of the selected memory block in response to the voltage control signal VCON of the control circuit 220. The voltage supply circuit 230 may include a voltage generating unit and a row decoder.

The voltage generating unit outputs the operating voltages necessary for the read operation on the memory cells to the global lines in response to the voltage control signal VCON.

The row decoder connects the global lines and the local lines DSL, WL0 to WLn, and SSL so that the operating voltages output from the voltage generating unit to the global lines may be transmitted to the local lines DSL, WL0 to WLn, and SSL of the selected memory block in the memory array 210 in response to the row address signals RADD of the control circuit 220.

The page buffer group 240 includes the page buffers PB1 to PBk connected with the memory array 210 through bit lines BL1 to BLk. The page buffers PB1 to PBk of the page buffer group 240 selectively precharge the bit lines BL1 to BLk according to data input in order to store data in the memory cells C01 to C0k, or sense voltages of the bit lines BL1 to BLk in order to read the data from the memory cells in response to the PB control signal PBCON of the control circuit 220.

The column decoder 250 selects the page buffers PB1 to PBk included in the page buffer group 240 in response to the column address signal CADD output from the control circuit 220. That is, the column decoder 250 sequentially transmits the data to be stored in the memory cells to the page buffers PB1 to PBk in response to the column address signal CADD. Further, the column decoder 250 sequentially selects the page buffers PB1 to PBk in response to the column address signal CADD so that the data of the memory cells latched in the page buffers PB1 to PBk by the read operation is output to the outside.

In order to store the data in the memory cells during the program operation, the input/output circuit 260 transmits the data to the column decoder 250 under control of the control circuit 220 in order to input the data input from the outside to the page buffer group 240. When the column decoder 250 transmits the data transmitted from the input/output circuit 260 to the page buffers PB1 to PBk of the page buffer group 240, the page buffers PB1 to PBk store the input data in internal latch circuits. Further, the input/output circuit 260 outputs the data transmitted through the column decoder 250 from the page buffers PB1 to PBk of the page buffer group 240 to the outside.

FIG. 9 is a flowchart for describing an operating method of the data storing system according to the embodiment of the present invention.

Referring to FIG. 9, when the read operation is failed, a read operation is performed again by changing a read voltage level as described below.

In the operating method of the data storing system, a read operation is performed with the first read voltage in the read retry table (S310). A direction of the change of the first read voltage is the first direction. The first read voltage may be a read voltage when the read operation on a previous page is passed. The first direction may be a read operation performance direction used when the read operation on the previous page is passed. When the first read voltage and the first direction are stored in different memory blocks, the read operation using the stored first read voltage and the stored first direction may be performed.

Next, an error correction operation on the read data is performed by the controller. When the read operation is failed, the read data is stored in the buffer unit (S320). The read data may be stored at the first position of the buffer unit.

Next, it is checked whether the number of the read operation is 3 or more (S340).

Since the number (1) of the read operation is smaller than 3, the read operation is performed with the second read voltage adjacent to the first read voltage in the first direction on the read retry table (S350).

When the error correction operation on the read data is performed and the read operation is failed, the read data is stored in the buffer unit (S320). The read data may be stored at the second position of the buffer unit.

Next, it is checked whether the number of the read operation is 3 or more (S340).

Since the number (2) of the read operation is smaller than 3, the read operation is performed with the third read voltage adjacent to the second read voltage in the first direction on the read retry table (S350).

When the error correction operation on the read data performed and the read operation is failed, the read data is stored in the buffer unit (S320). The read data may be stored at the third position of the buffer unit (S330).

Next, it is checked whether the number of the read operation 3 or more (S340).

Since the number (3) of the read operation is equal to or larger than 3, a read voltage for the performance of the read operation is determined in the read retry table based on the data stored at the first to third positions of the buffer unit, and then the read operation is performed with the determined read voltage.

Particularly, the number of first memory cells having threshold voltages between the first read voltage and the second read voltage and the number of second memory cells having threshold voltages between the second read voltage and the third read voltage based on the data stored at the first to third positions of the buffer unit (S360), and a read voltage for the performance of the read operation is determined in the read retry table based on the number of first memory cells and the number of second memory cells (S370).

More particularly, when the number of first memory cells is greater than the number of second memory cells (N>0) it is determined to perform the read operation using the read voltage adjacent to the third read voltage in the first direction on the read retry table (S350), and when the number of first memory cells is smaller than the number of second memory cells (N<0), it is determined to perform a next read operation using the read voltage adjacent to the first read voltage in a direction, which is opposite to the first direction, on the read retry table (S380).

When the read operation is passed in step S320, the read voltage and the direction during the performance of the corresponding read operation are stored (S390).

Accordingly, the operating method of the data storing system controls a direction of changing a level of the read voltage on the read retry table, so that the number of the read operation may be decreased, thereby improving performance of the system.

FIGS. 10 and 11 are diagrams for describing a read operation performance order illustrated in FIG. 9.

Referring to FIG. 10, the read operation is performed based on first to eighth read voltages. A first read operation is performed with the first read voltage (1), and when the first read operation is failed, a second read operation is performed with the second read voltage (2). When the second read operation is failed, a third read operation is performed with the third read voltage (3). Fourth to eighth read operations are performed with the fourth to eighth read voltages (4 to 8) through the aforementioned method. When the eighth read operation is failed, the first read operation is performed again with the first read voltage (1).

Referring to FIG. 11, as an embodiment, when it is assumed that the read voltage, at which the read operation on a previous page is passed, is the second read voltage, and the direction is a forward direction, the read operation is performed with the second to fourth read voltages. When the number B of memory cells having threshold voltages between the second read voltage and the third read voltage is greater than the number A of memory cells having threshold voltages between the third read voltage and the fourth read voltage, the read operation is performed in a direction of a crossing point of two threshold voltage distributions. Accordingly, the read operation is performed in the forward direction.

Next, the read operation is performed with the fifth read voltage. Since the number of memory cells having threshold voltages between the third read voltage and the fourth read voltage is greater than the number of memory cells having threshold voltages between the fourth read voltage and the fifth read voltage, the read operation is performed in the forward direction.

Next, the read operation is performed with the sixth read voltage. When the number of memory cells having threshold voltages between the fourth read voltage and the fifth read voltage is smaller than the number of memory cells having threshold voltages between the fifth read voltage and the sixth read voltage, the read operation is performed in a direction away from a crossing point of two threshold voltage distributions. Accordingly, the read operation is performed in a backward direction.

As another embodiment, when it is assumed that the read voltage, at which the read operation on a previous page is passed, is the fourth read voltage, and the direction is the forward direction, the read operation is performed with the fourth to sixth read voltages. When the number B of memory cells having threshold voltages between the fourth read voltage and the fifth read voltage is smaller than the number A of memory cells having threshold voltages between the fifth read voltage and the sixth read voltage, the read operation is performed in a direction away from a crossing point of two threshold voltage distributions. Accordingly, the read operation is performed in the backward direction.

Next, the read operation is performed with the third read voltage adjacent to the fourth read voltage in the backward direction. When the number of memory cells having threshold voltages between the fourth read voltage and the fifth read voltage is smaller than the number of memory cells having threshold voltages between the third read voltage and the fourth read voltage, the read operation is performed in the forward direction, which is opposite to the backward direction, again. That is, the read operation is performed with the seventh read voltage adjacent to the sixth read voltage in the forward direction. Since the number of memory cells having threshold voltages between the fifth read voltage and the sixth read voltage is smaller than the number of memory cells having threshold voltages between the sixth read voltage and the seventh read voltage, the read operation is performed again with the read voltage listed on the backward direction.

The read retry operation is performed in the aforementioned order, so that a time to search for a read voltage at which the read operation is passed may be decreased. For example, when the read operation using the third read voltage is passed, the read operation is performed by using the fourth to sixth read voltages, and then the read operation is performed by using the third read voltage without using the seventh read voltage, so that it may be possible to rapidly search for the read voltage at which the read operation is passed.

Figure 12:
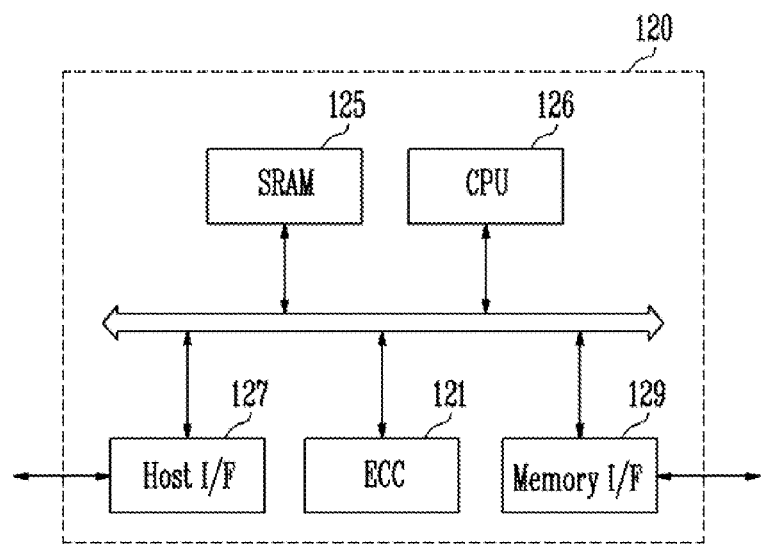
FIG. 12 is a detailed diagram of a controller illustrated in FIG. 4.

FIG. 12 is a detailed block diagram of the controller 120 illustrated in FIG. 4.

The data storing system 100 illustrated in FIG. 4 may be provided as a memory card or a Solid-State Disk (SSD) by a combination of the semiconductor device 110 and the controller 120.

Referring to FIG. 12, the controller 120 may include an SRAM 125, a processing unit (CPU) 126, a host interface (I/F) 127, the error correction unit 121 and a memory interface (I/F) 129. The SRAM 125 is used as a working memory of the processing unit 126. The host interface 127 includes a data exchange protocol of a host connected with the data storing system 100. The error correction block 121 detects and corrects an error included in the data read from the semiconductor device 110. The memory interface 129 interfaces with the semiconductor device 110. The processing unit 126 performs a general control operation for the data exchange of the controller 120.

Although it is not illustrated in the drawing the data storing system 100 may further include a ROM (not shown) storing code data for interfacing with the host. The semiconductor device 110 may also be provided in a form of a multi-chip package including a plurality of flash memory chips. The data storing system 100 may be provided as a storage medium having a low error generation probability and high reliability. Especially, the semiconductor device 110 may be included in a memory system, such as an SSD. In this case, the controller 120 may communicate with an external device, for example, the host, through one of various interface protocols, such as eMMC, UFS, USB, MMC, PCI-E, SATA, DATA, SCSI, ESDI, and IDE.

Figure 13:
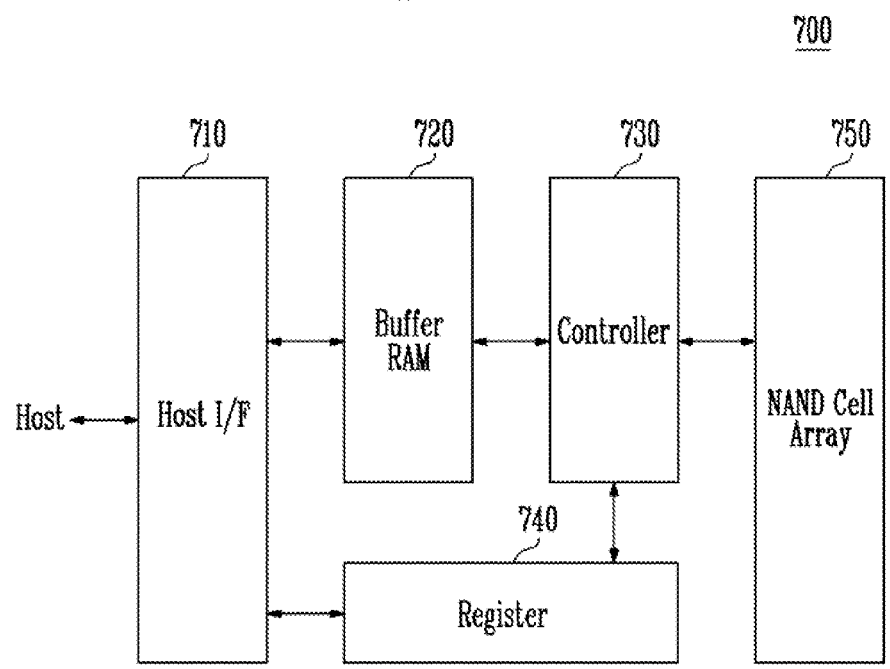
FIG. 13 is a block diagram illustrating a fusion memory device or a fusion memory system performing operations according to an embodiment of the invention.

FIG. 13 is a block diagram illustrating a fusion memory device or a fusion memory system performing program operations according to aforementioned various embodiments of the invention. For example, the technical features of the embodiments of the present invention may be applied a OneNAND flash memory device 700 as a fusion memory device.

The OneNAND flash memory device 700 includes a host interface 710 for exchanging various information with a device using different protocols, a buffer RAM 720 including a code for driving the memory device, or temporarily storing data, a controller 730 configured to control a read, a program, and all states in response to a control signal and a command provided from the outside, a register 740 storing a command, an address, and data, such as configuration, defining a system operating environment within the memory device, and a NAND flash cell array 750 formed of the operating circuit including a non-volatile memory cell and a page buffer. The OneNAND flash memory device programs the data in response to a write request from the host by the aforementioned method.

Figure 14:
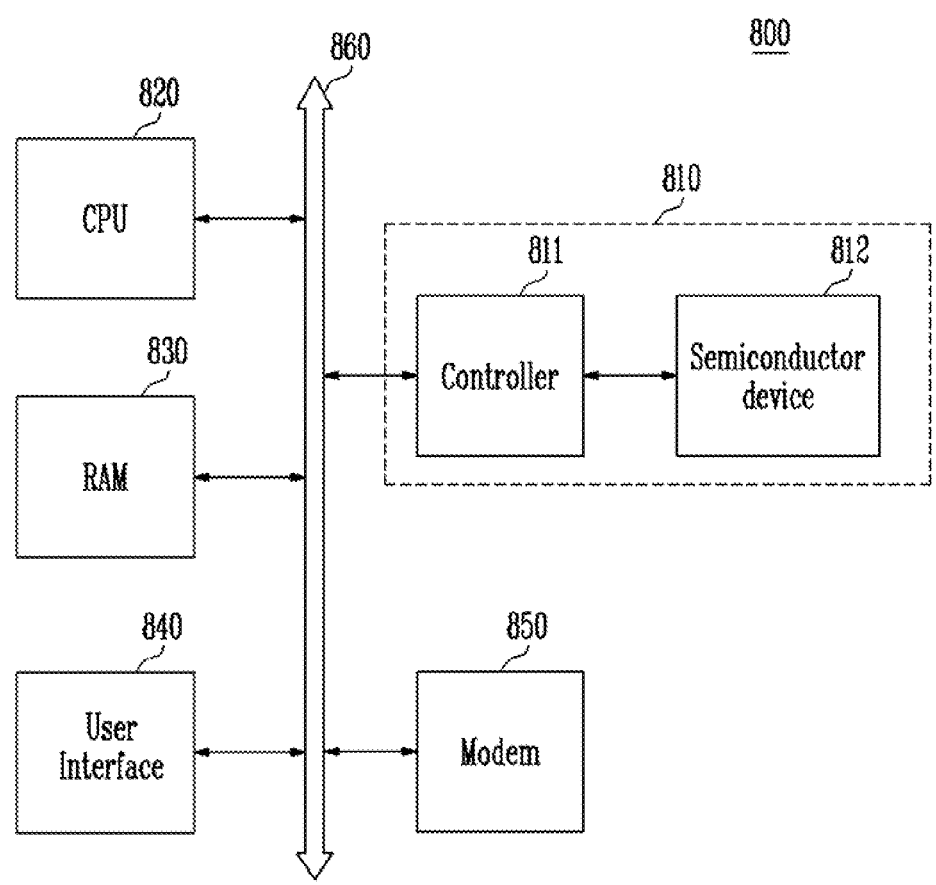
FIG. 14 is a block diagram illustrating a computing system including a data storing system according to an embodiment of the present invention.

FIG. 14 illustrates a computing system 800 including a data storing system 810 according to the embodiment of the present invention.

The computing system 800 may include a microprocessor 820 electrically connected to a system bus 860, a RAM 830, a user interface 840, a modem 850, such as a baseband chipset, and the data storing system 810. If the computing system 800 is a mobile device, a battery (not shown) for supplying an operating voltage of the computing system 800 may be further provided. Although it is not illustrated in the drawing, the computing system 800 may further include an application chipset a camera image processor, a mobile DRAM, and the like. The data storing system 810 may configure, for example, an SSD using a non-volatile memory for storing data. Otherwise, the data storing system 810 may be provided as a fusion flash memory, for example, a OneNAND flash memory.

The above-mentioned exemplary embodiments of the present invention are not embodied only by an apparatus and method. Alternatively, the above-mentioned exemplary embodiments may be embodied by a program performing functions, which correspond to the configuration of the exemplary embodiments of the present invention, or a recording medium on which the program is recorded. These embodiments can be easily devised from the description of the above-mentioned exemplary embodiments by those skilled in the art to which the present invention pertains.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of operating a data storing system, comprising:
   performing a read operation using a first read voltage listed on a read retry table;
   storing read data at a first position of a buffer when the read operation fails;
   performing a read operation using a second read voltage adjacent to the first read voltage in a first direction on the read retry table;
   storing read data at a second position of the buffer when the read operation fails;
   performing a read operation using a third read voltage adjacent to the second read voltage in the first direction on the read retry table;
   storing read data at a third position of the buffer when the read operation fails;
   changing a direction on the read retry table to determine a read voltage to be used for the read operation among read voltages listed on the read retry table based on the data stored at the first to third positions of the buffer;
   performing the read operation using the determined read voltage; and
   storing the determined read voltage which is used when the read operation passes and the direction during the read operation when the read operation passes.

2. The method of claim 1, wherein the determining of the read voltage includes:
   calculating the number of first memory cells having threshold voltages between the first read voltage and the second read voltage, and the number of second memory cells having threshold voltages between the second read voltage and the third read voltage based on the data stored at the first to third positions of the buffer; and
   determining the read voltage to be used for the read operation on the read retry table based on the number of first memory cells and the number of second memory cells.

3. The method of claim 2, wherein, when the number of first memory cells is greater than the number of second memory cells, a read voltage adjacent to the third read voltage in the first direction on the read retry table is determined to be used for performing the read operation, and when the number of first memory cells is smaller than the number of second memory cells, a read voltage adjacent to the first read voltage in a second direction is determined to be used for performing a next read operation.

4. The method of claim 1, wherein the first read voltage is a read voltage when the read operation on a previous page passes.

5. The method of claim 1, wherein the first direction is a read operation performance direction used when the read operation on a previous page passes.

6. A data storing system, comprising:
   a semiconductor device configured to repeatedly perform a read operation by changing a level of a read voltage according to read voltages listed on a read retry table when a read operation on a selected page passes, in response to a command and an address; and
   a controller configured to control the read operation of the semiconductor device by generating the command and the address, wherein a direction is changed on the read retry table to determine a read voltage to be used for performing the read operation among the read voltages listed on the read retry table when the semiconductor device performs the read operation based on data read as a result of a predetermined number of read operations, wherein when the read operation passes, the semiconductor device stores the determined read voltage which is used when the read operation passes and the direction during the read operation.

7. The data storing system of claim 6, wherein the controller includes:
   an error correction unit configured to correct an error bit of the read data, compare the number of error bits of the read data and the number of correctable error bits, and determining whether the read operation passes or fails;
   a buffer unit configured to store the read data when the read operation fails;
   a calculation unit configured to calculate the number of memory cells between the read voltages during the performance of the read operation based on data stored in the buffer unit; and
   a command and address generator configured to generate the command and the address to perform the read operation using a specific read voltage determined among the read voltages listed on the read retry table based on the number of memory cells when the read operation fails.

8. The data storing system of claim 7, wherein the buffer unit stores the read data at a first position when the read operation performed with a first read voltage on the read retry table fails, stores the read data at a second position when the read operation performed with a second read voltage adjacent to the first read voltage in a first direction on the read retry table fails, and stores the read data at a third position when the read operation performed with a third read voltage adjacent to the second read voltage in the first direction on the read retry table fails, and
   the calculating unit calculates the number of first memory cells having threshold voltages between the first read voltage and the second read voltage, and the number of second memory cells having threshold voltages between the second read voltage and the third read voltage based on the data stored at the first to third positions of the buffer unit.

9. The data storing system of claim 8, wherein the command and address generating unit generates a command to perform the read operation using a read voltage adjacent to the third read voltage in the first direction on the read retry table when the number of first memory cells is greater than the number of second memory cells, and generates a command to perform a next read operation using a read voltage adjacent to the first read voltage in a second direction, which is opposite to the first direction, on the read retry table when the number of first memory cells is smaller than the number of second memory cells.

10. The data storing system of claim 8, wherein the first read voltage is a read voltage when the read operation on a previous page passes.

11. The data storing system of claim 8, wherein the first direction is a read operation performance direction used when the read operation on a previous page passes.

* * * * *